(12) United States Patent
Ozawa et al.

(10) Patent No.: US 7,251,801 B2
(45) Date of Patent: Jul. 31, 2007

(54) METHOD OF DESIGNING CIRCUIT BOARD

(75) Inventors: Kaname Ozawa, Kawasaki (JP);
Mitsutaka Sato, Kawasaki (JP);
Tetsuya Fujisawa, Kawasaki (JP);
Yoshiyuki Yoneda, Kawasaki (JP);
Ryuji Nomoto, Kawasaki (JP);
Yoshitaka Aiba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 111 days.

(21) Appl. No.: 11/019,156

(22) Filed: Dec. 23, 2004

(65) Prior Publication Data
US 2006/0040532 A1  Feb. 23, 2006

(30) Foreign Application Priority Data
Aug. 18, 2004  (JP) ............................. 2004-238337

(51) Int. Cl.
*G06F 17/50* (2006.01)
(52) U.S. Cl. .............................. 716/15; 716/12; 716/13
(58) Field of Classification Search ............ 716/12–13, 716/15; 439/108
See application file for complete search history.

(56) References Cited

U.S. PATENT DOCUMENTS

| | | | | |
|---|---|---|---|---|
| 4,613,941 A | * | 9/1986 | Smith et al. | 716/12 |
| 5,247,455 A | * | 9/1993 | Yoshikawa | 716/15 |
| 5,644,500 A | * | 7/1997 | Miura et al. | 716/8 |
| 5,847,968 A | * | 12/1998 | Miura et al. | 716/8 |
| 5,875,117 A | * | 2/1999 | Jones et al. | 716/14 |
| 6,011,694 A | * | 1/2000 | Hirakawa | 361/774 |
| 6,295,634 B1 | * | 9/2001 | Matsumoto | 716/12 |
| 6,510,544 B1 | * | 1/2003 | Matsumoto et al. | 716/12 |
| 6,584,608 B1 | * | 6/2003 | Kumada et al. | 716/15 |
| 6,643,839 B1 | * | 11/2003 | Nishio et al. | 716/15 |
| 2003/0084418 A1 | * | 5/2003 | Regan | 716/14 |
| 2003/0226129 A1 | * | 12/2003 | Nakagawa et al. | 716/11 |

FOREIGN PATENT DOCUMENTS

| | | |
|---|---|---|
| JP | 4-34951 | 2/1992 |
| JP | 9-91318 | 4/1997 |
| JP | 10-171856 | 6/1998 |
| JP | 2790090 | 6/1998 |
| JP | 3087669 | 7/2000 |
| JP | 2003-345844 | 12/2003 |

* cited by examiner

*Primary Examiner*—Paul Dinh
*Assistant Examiner*—Suchin Parihar
(74) *Attorney, Agent, or Firm*—Westerman, Hattori, Daniels & Adrian, LLP.

(57) ABSTRACT

A method of design of a circuit board enabling high density conductor lines to be drawn efficiently. A rats nest is formed by connecting pads to which terminals of an electronic device are connected and external connection terminals by lines. A region with the highest density of lines of the rats nest is then selected and design rules relating to routes and dimensions of conductor lines are set in the region with the highest density of lines of the rats nest. Conductor lines are then laid at the region with the highest density of lines of the rats nest, and whether or not the conductor lines can be laid at the region with the highest density of lines of the rats nest is confirmed. Setting of the design rules and laying of conductor lines are if the conductor lines cannot be laid, and the conductor lines of the remaining regions are laid by the set design rules if the conductor lines can be laid.

7 Claims, 16 Drawing Sheets

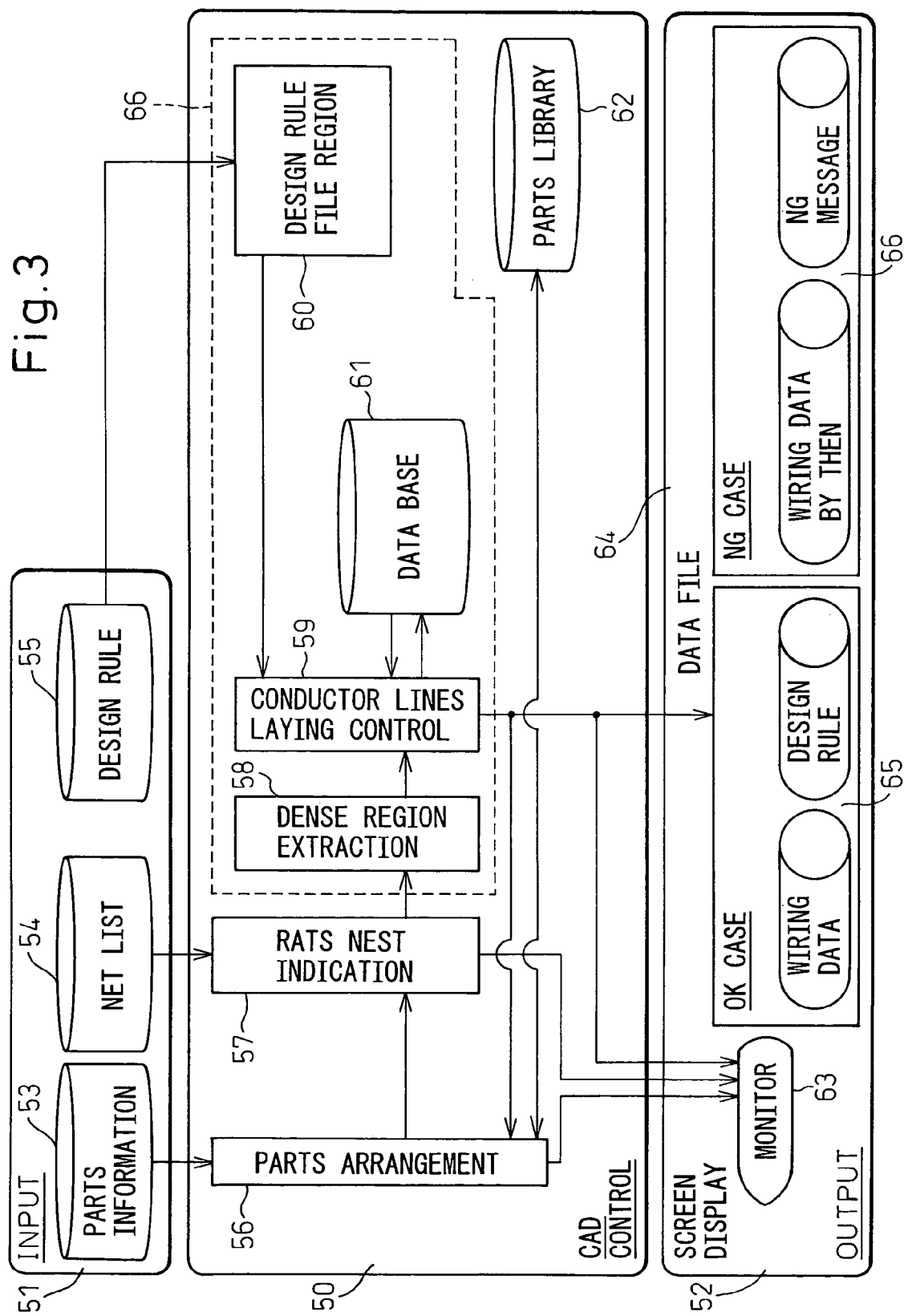

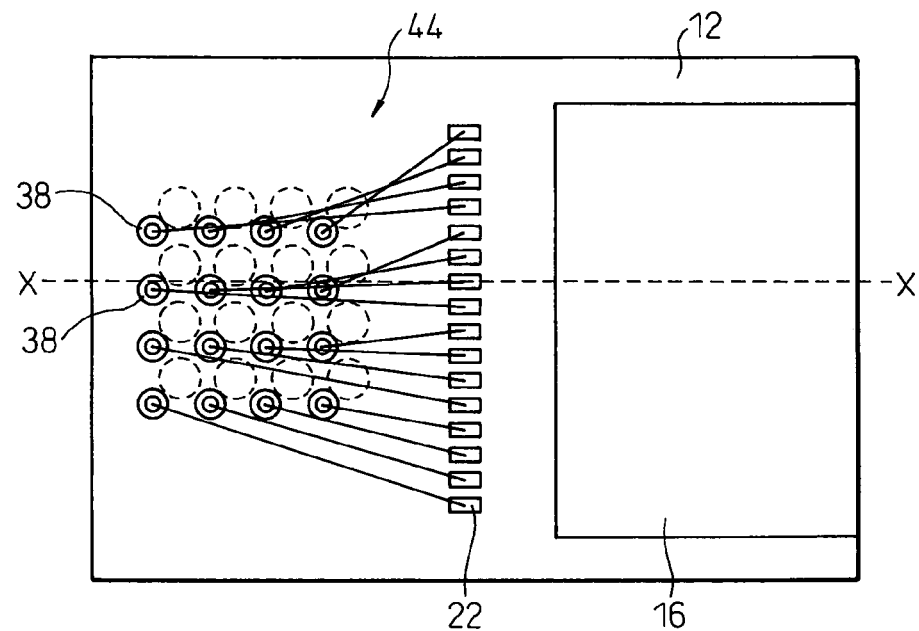
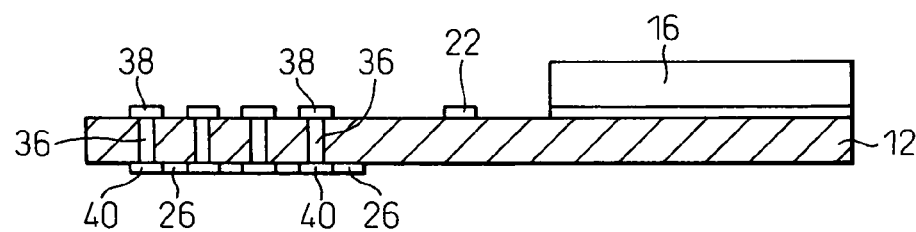
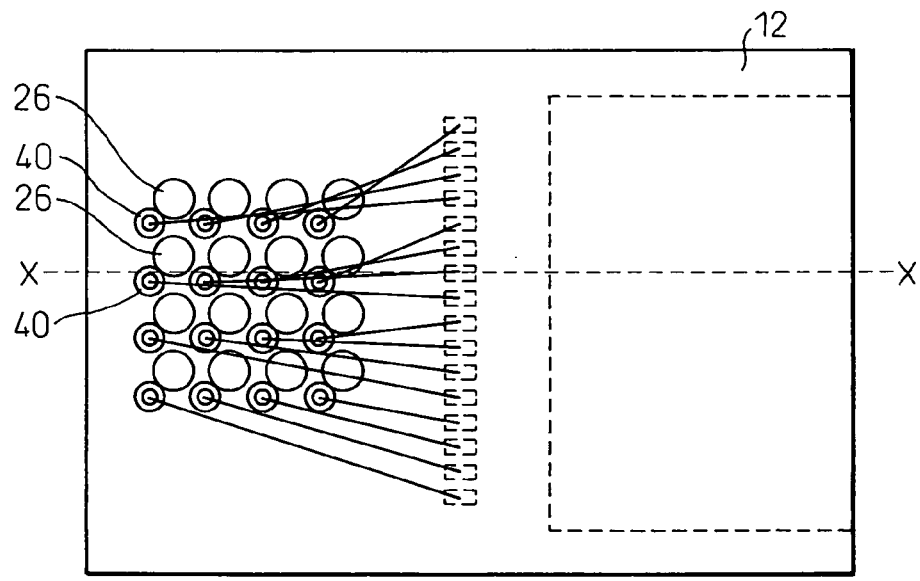

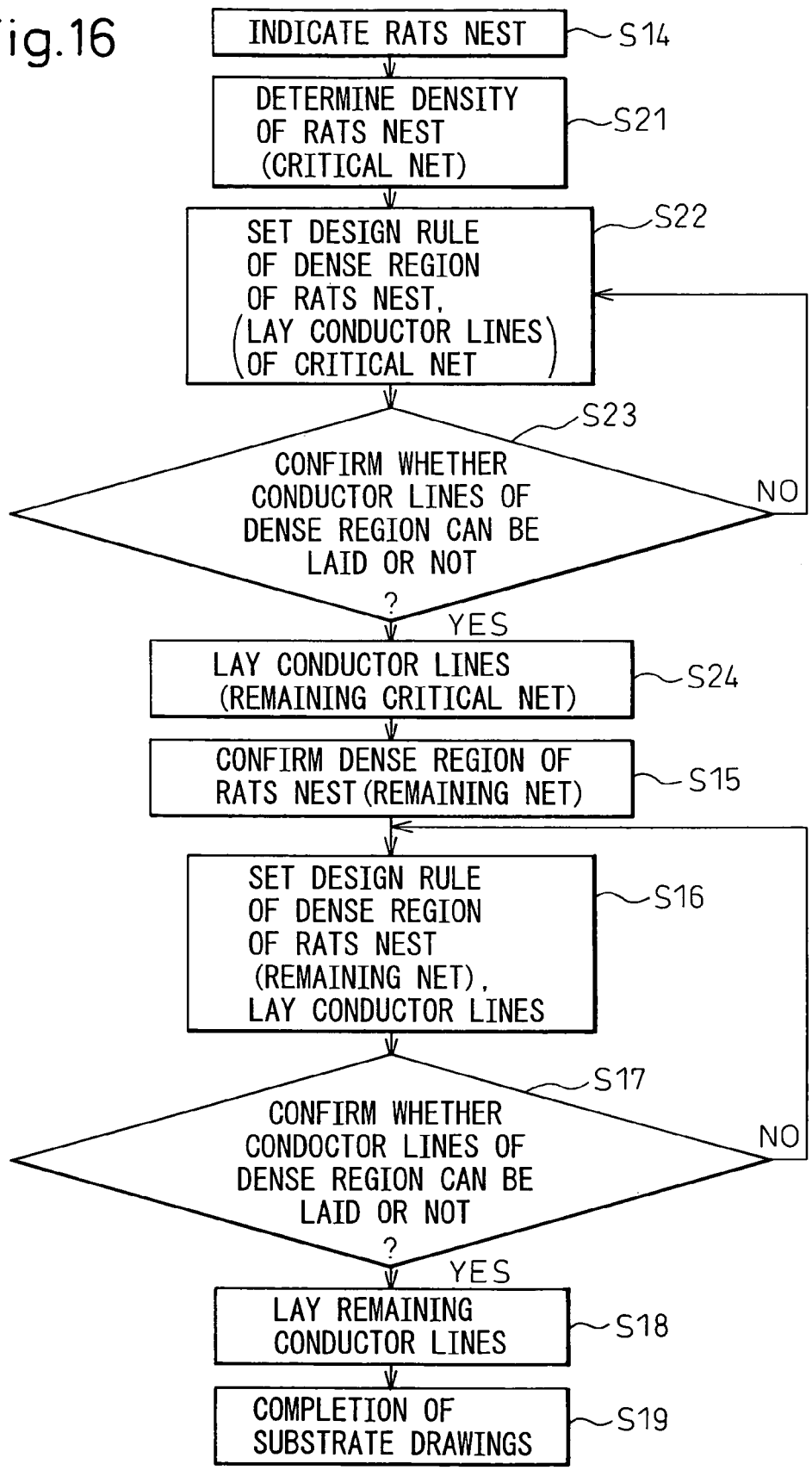

METHOD OF DESIGNING CIRCUIT BOARD

BACKGROUND OF THE INVENTION

1. Field of the Invention

The present invention relates to a method of designing a circuit board, and, more particularly, it relates to an improvement of the method of designing a circuit board applied to an electronic equipment, by computer-aided design (CAD).

2. Description of the Related Art

An electronic equipment includes a semiconductor device itself such a semiconductor chip and/or other electrical/electronic elements or a circuit board having an electronic device mounted thereon.

In order to meet the recent requirements for reducing the size and weight of the electronic equipment, the electronic device and the circuit board forming the electronic equipment is designed to be smaller in size and higher in density.

A high density circuit board is designed by a computer aided design (CAD). Incidentally, the circuit board is also named as a printed board, which is called as a circuit board here.

In the design of a circuit board by CAD, the board covered is formed with a "rats nest". This "rats nest" is used as road signs for laying conductor lines (for example, see Japanese Unexamined Patent Publication (Kokai) Nos. 4-34951, 9-91318, 10-171856, and 2003-345844).

For example, as shown in FIG. 18, at step S100, a semiconductor device (electronic device) is drawn. Next, at step S101, pads to which terminals of the electronic device are to be connected (in the case of wire bonding, bonding pads, while in the case of flip-chip, flip-chip connection pads) and external connection terminals are drawn.

The external connection terminals are comprised of for example ball lands to which solder balls are mounted. The conductor lines include vias passing through the circuit board and via lands at the two ends of the vias.

Next, at step S102, the electronic devices are provisionally placed (for "floor plan") at a designated region of the circuit board (region corresponding to external shape of circuit board).

At step S103, the pads to which the terminals of the electronic devices are connected and the external connection terminals are connected by straight lines, and the pads to which the terminals of a plurality of electronic devices are connected are connected by straight lines. This group of straight lines is called a "rats nest" and serves as road signs for laying conductor lines.

Suitably thereafter, at step S104, the density of the rats nest is confirmed.

A dense region of the rats nest also has dense conductor lines.

Therefore, with this alone, there is a possibility that the laying of conductor lines may become difficult. Therefore, the rats nest is preferably as sparse as possible.

Accordingly, when there is a region with a high density of the rats nest (NO), the routine returns to step S102, where the positions of the electronic devices themselves are moved so that the rats nest becomes sparse (correction of floor plan).

When the density of the rats nest is not so high (YES), the routine proceeds to step S105.

After improving the rats nest in this way, the conductor lines are laid using this rats nest as road signs.

Next, at step S106, whether the arrangement and the laying of the conductor lines is possible or impossible is confirmed or checked. When NO, the routine returns to step S102, where the floor plan is redone.

When YES, the drawing of the circuit board is completed at step S107.

This method of designing the circuit board of the related art can be an effective means for the design of a circuit board with extra space for mounting parts, that is, a relatively large circuit board such as a mother board of a PC etc.

However, in the design of a circuit board with poor extra space for mounting parts, for example, a mother board of a mobile phone or for example a relatively small circuit board such as an interposer used for configuring a System In Package (SIP), there are limits to the space for moving the semiconductor devices to be mounted, so sometimes a dead end is reached with the related art in which the floor plan is repeatedly redone.

Further, in the case where the conductor lines are laid and such a result is discovered that it is impossible to lay all the conductor lines when reaching the final state of the designing process, the routine returns to the initial floor plan, and the arrangement of semiconductor devices is changed, the rats nest is formed, then the conductor lines are laid again.

Therefore, the number of steps in the design process becomes extremely large, the design period is increased, and therefore a large amount of time is required for development of electronic equipment.

In this way, the increase in the development time of a circuit board becomes a major obstacle in development of electronic equipment with short product cycles.

SUMMARY OF THE INVENTION

An object of the present invention is to provide a method of designing a circuit board enabling high density conductor lines to be drawn more efficiently.

According to this configuration, design rules enabling conductor lines to be laid are set and the conductor lines are laid in the region with the highest density of lines of the rats nest. After this, the design rules enabling conductor lines to be laid in the region with the highest density of lines of the rats nest are used to lay the conductor lines in the remaining regions. The region with the highest density of lines of the rats nest is the region where laying of the conductor lines is the most difficult, so if using the design rules set here, it is possible to lay the conductor lines reliably even in other regions. Therefore, it is possible to avoid the situation of the conductor lines being unable to be laid when reaching the final stage of laying the conductor lines. There is therefore little backtracking of the process and the conductor lines can be laid reliably in a short time.

According to the present invention, the number of design steps can be reduced down to about one-half that of the related art.

BRIEF DESCRIPTION OF THE DRAWINGS

These and other objects and features of the present invention will become clearer from the following description of the preferred embodiments given with reference to the attached drawings, wherein:

FIGS. 2A to 2C are views of a typical example of some of the conductor lines of FIG. 1, wherein FIG. 2A is a sectional view of a part A of FIG. 1, FIG. 2B is a top view of FIG. 2A, and FIG. 2C is a bottom view of a see-through state of FIG. 2A;

FIG. 3 is a view of a control program setting design rules for designing a circuit board using a CAD;

FIGS. 5A to 5C are views of a display screen of a computer, wherein FIG. 5A is a view of a semiconductor device, FIG. 5B is a view of the semiconductor device and pads, and FIG. 5C is a view of a provisionally placed semiconductor device and rats nest;

FIGS. 9A to 9C show a reference example for setting design rules, wherein FIG. 9A is a top view, FIG. 9B is a sectional view, and FIG. 9C is a view in the see-through state;

FIGS. 10A to 10C show an example of conductor lines laid according to the design rules of FIGS. 9A to 9C, wherein FIG. 10A is a top view, FIG. 10B is a sectional view, and FIG. 10C is a bottom view in the see-through state;

FIGS. 11A to 11C show a reference example of conductor lines, wherein FIG. 11A is a top view, FIG. 11B is a sectional view, and FIG. 11C is a bottom view in the see-thru state;

FIGS. 13A to 13C show an example of conductor lines formed based on the rats nest of FIG. 12, wherein FIG. 13A is a top view, FIG. 13B is a sectional view, and FIG. 13C is a bottom view in the see-through state;

FIGS. 14A to 14C show a reference example for setting the design rules, wherein FIG. 14A is a top view, FIG. 14B is a sectional view, and FIG. 14C is a bottom view in the see-through state;

FIGS. 15A to 15C show a reference example for setting the design rules, wherein FIG. 15A is a top view, FIG. 15B is a sectional view, and FIG. 15C is a bottom view in the see-through state;

FIG. 16 is a flow chart for explaining the method of designing a circuit board according to a second embodiment of the present invention;

DESCRIPTION OF THE PREFERRED EMBODIMENTS

Preferred embodiments of the present invention will be described in detail below while reference to the attached figures.

Figure 1:
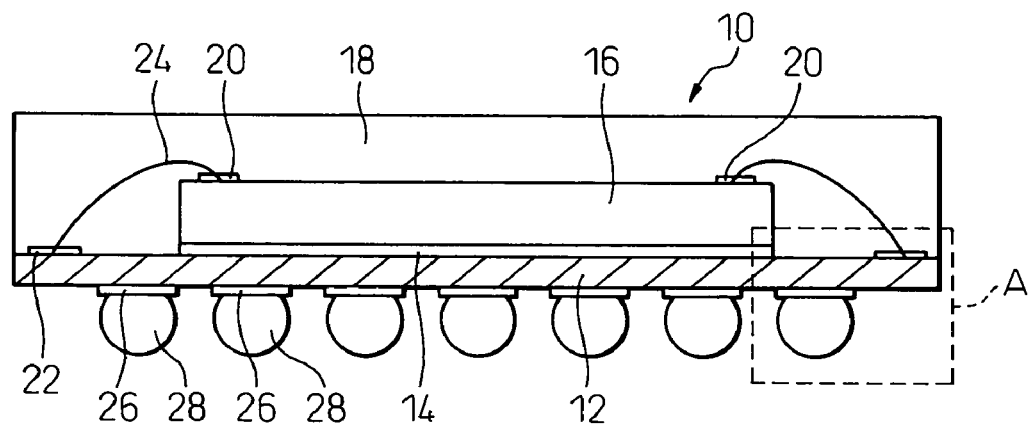
FIG. 1 is a sectional view of an example of a semiconductor package designed according to the present invention.

FIG. 1 shows an example of a semiconductor package including a circuit board to which the method of designing a circuit board according to the present invention is applied.

In FIG. 1, the semiconductor package 10 is comprised of a circuit board 12, a semiconductor device 16 mounted on the circuit board 12 by an adhesive 14, and a resin 18 sealing the semiconductor device 16.

The semiconductor device 16 is a semiconductor chip formed with an integrated circuit and has terminals 20 formed along with the integrated circuit.

In this structure, the circuit board 12 is comprised of an insulating board made of glass epoxy etc. One major surface is formed with pads 22 to which terminals 20 of the semiconductor device 16 are connected. The terminals 20 of the semiconductor device 16 are connected to the pads 22 of the circuit board 12 by bonding wires 24. The illustrated pads 22 are pads for wire bonding, but if the electrode configuration of the semiconductor device is a flip-chip configuration, the pads 22 can be made suitable for flip-chip bonding.

The circuit board 12 has external connection terminals 26 at its other major surface. The external connection terminals 26 are formed as ball lands to which solder balls 28 are attached.

The external connection terminals 26 will be called "ball lands" hereinafter, but the external connection terminals are not limited to ball lands.

The semiconductor package 10 shown in FIG. 1 is generally called a ball grid array (BGA) type semiconductor package. It is mounted to a mother board (not shown) of electronic equipment using solder balls 28.

Figure 2A:
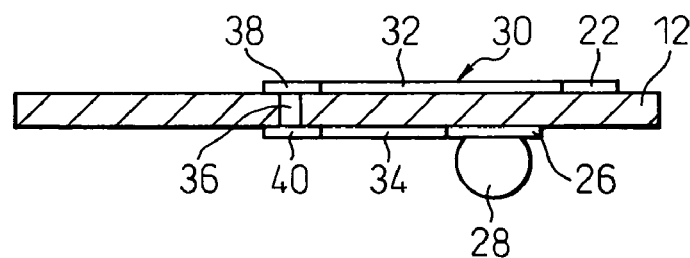
Figure 2B:
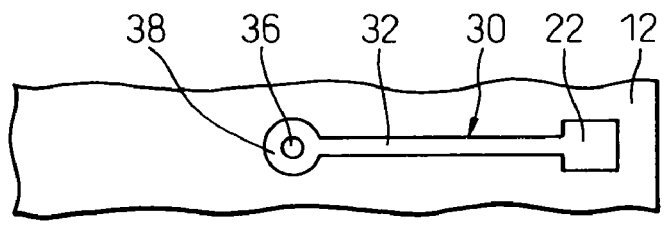
Figure 2C:
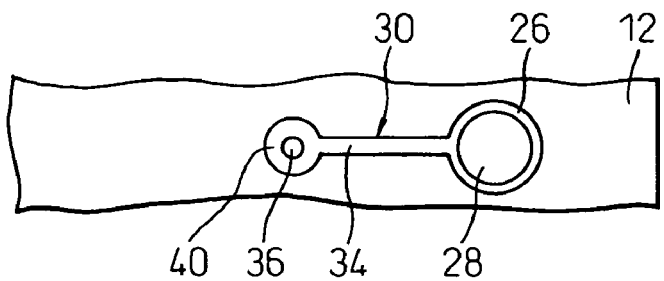

FIGS. 2A to 2C are views of a typical example of some of the conductor lines of FIG. 1, wherein FIG. 2A is a sectional view of a part A of FIG. 1, FIG. 2B is a top view of FIG. 2A, and FIG. 2C is a bottom view of see-through state of FIG. 2A.

In the circuit board 12, the pads 22 and ball lands 26 are electrically connected by conductor lines 30.

Each conductor line 30 includes a first linear part 32 provided on the first major surface of the circuit board 12 on which the semiconductor device 16 is mounted (hereinafter referred to as the "first side"), a second linear part 34 provided on the second major surface of the circuit board 12 on which the ball lands 26 are provided (hereinafter referred to as the "second side"), and a via 36 connecting the first linear part 32 and the second linear part 34.

The end of the via 36 at the first side is provided with a via land 38, while the end of the via 36 at the second side is provided with a via land 40.

On the other hand, the via lands 38 and 40 have areas larger than the via 36. The via land 38 of the first side and the via land 40 of the second side usually have the same diameters.

The diameters of the ball lands 26 are larger than the diameters of the via lands 38 and 40.

The circuit board 12 is formed with a plurality of conductor lines 30 at a high density.

The conductor lines 30 are drawn by the routine explained below and are formed by selectively arranging a copper or other conductor layer on the circuit board 12.

FIG. 3 shows the configuration of a CAD system used for working the method of designing a circuit board according to the present invention.

In FIG. 3, 50 indicates a CAD controller, 51 input information, and 52 output information.

The input information 51 includes parts information 53 (external dimensions, number of pins, etc. of semiconductor device), net list (connection information) 54, and design rules (initial values) 55.

This input information 51 is input by the user, that is, the circuit board designer, to the CAD controller 50 using a mouse, keyboard, or other input device.

The CAD controller 50 draws a semiconductor device based on the parts information 53 or draws pads and ball lands from the parts information 53 and arranges these at suitable locations of the circuit board (parts arrangement 56).

Next, a rats nest is displayed from the parts layout 56 and the net list 54 (rats nest display 57).

The arrangement information of the electronic device and rats nest are displayed as the output information 52 on the screen of the monitor 63. Further, various information is displayed on the screen of the monitor 63 in accordance with need.

Note that this information is stored in a parts library 62 in the CAD controller 50 and is useful for design of parts.

Here, the region with the highest density of the rats nest displayed is extracted (dense region extraction 58).

After the dense region extraction 58, the conductor line laying control 59 is performed in accordance with the results.

The design rules which the user inputs (initial values) 55 are incorporated once into the design rule file region 60 in the CAD controller 50.

These design rules (initial values) 55 are used as initial values of the design rules of the conductor lines and the conductor lines are laid by the conductor line laying control 59.

If the conductor lines can be laid by these initial values, the conductor line data of the densest part of the rats nest and the design rules at that time are output as the data file and simultaneously displayed on the monitor 63.

However, when the conductor lines cannot be laid by these initial values, the design rules are changed while comparing them with the values of the database 61 stored in the CAD controller 50, design rules enabling the conductor lines to be laid are searched for, and the conductor lines are laid.

The output information 52 includes a data file 64. When the conductor lines can be laid (OK), the conductor line data of the densest part of the rats nest and the design rule at that time are output as the data 65.

Note that when conductor lines cannot be laid with any combination of all design rules of the data base (NG), a message showing that conductor lines cannot be laid and the intermediate wiring data are output as the data 66. In this case, the routine returns to the floor plan process and the floor plan is studied again.

Figure 4:
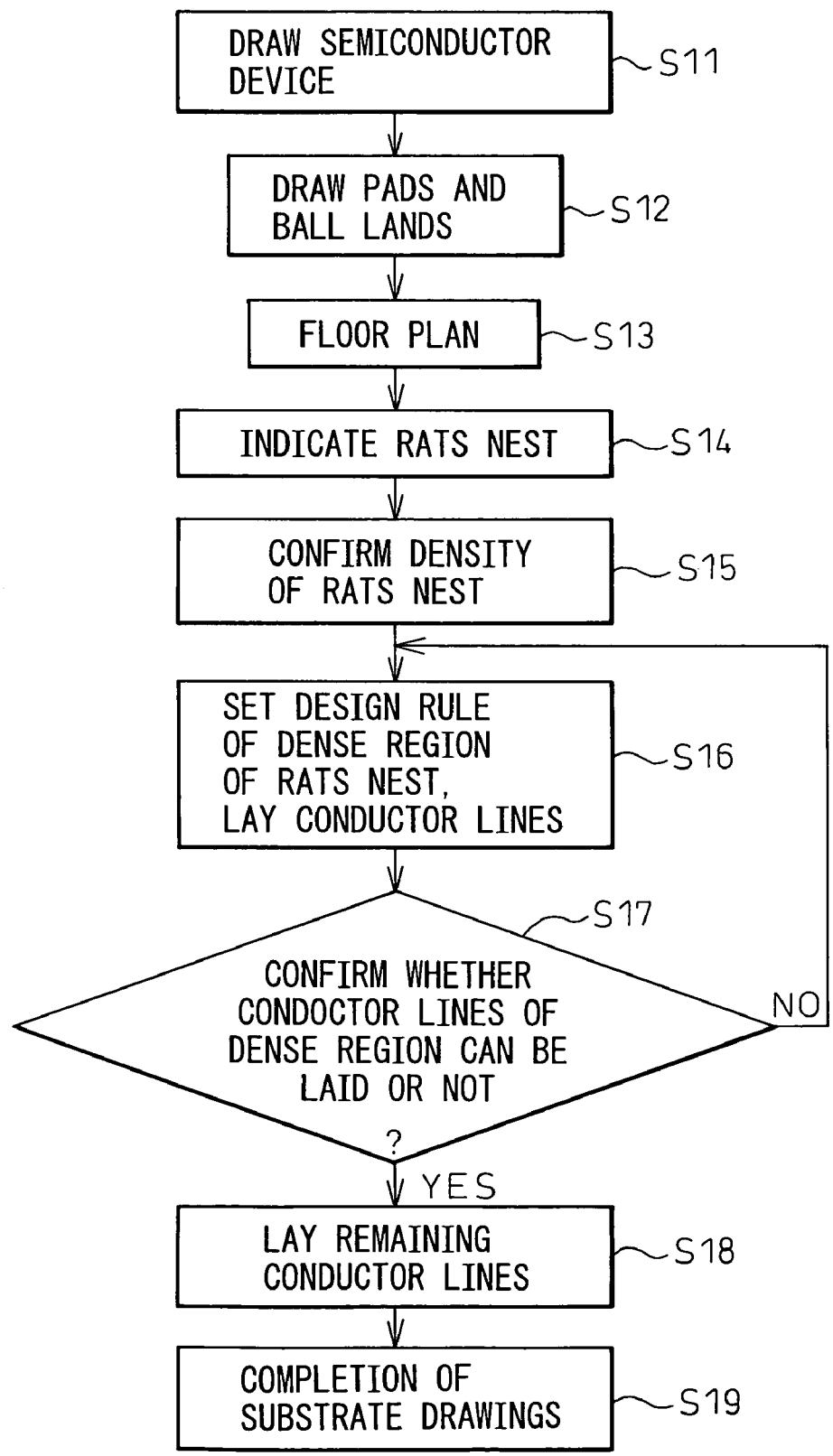
FIG. 4 is a flow chart for explaining the method of designing a circuit board according to a first embodiment of the present invention.

A FIG. 4 shows flow chart for explaining the method of designing a circuit board according to the present invention.

This design method can be applied to mother boards, interposers, and many other circuit boards, but here the example of an interposer shown in FIG. 1 and FIGS. 2A to 2C will be explained.

Note that the mother board, interposer, or other circuit board comprises an insulating board made of polyimide or glass epoxy (dielectric board) on the surface and/or inside of which conductive wires are selectively arranged. As the material of the conductor lines, in general a material mainly comprised of copper (Cu) is used.

According to the present invention, the semiconductor device 16 mounted on the circuit board 12 is drawn, based on the part information 53 (FIG. 3) at step S11, using CAD.

In this case, sometimes the circuit board 12 mounts a single semiconductor device 16. Other times a plurality of semiconductor devices 16 are mounted on a common circuit board 12.

Alternatively, a semiconductor device 16 and other parts are mounted on a single circuit board 12.

At step S12, the pads corresponding to the electrodes of the semiconductor device 16 are drawn on one major surface (first surface) of the circuit board and the ball lands 26 are drawn on the other major surface (second surface) of the circuit board based on the net list 54 (FIG. 3).

Next, at step S13, the semiconductor device 16 is floor-planned (provisionally placed) on in a designated region (region corresponding to external shape of circuit board 12). This corresponds to the parts arrangement 56 (FIG. 3).

Next, at step S14, the rats nest is displayed (corresponding to rats nest display 57 (FIG. 3)).

Figure 5A:
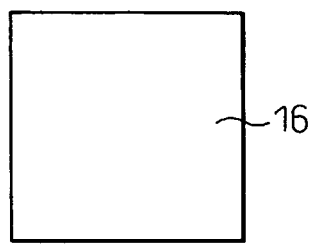
Figure 5B:
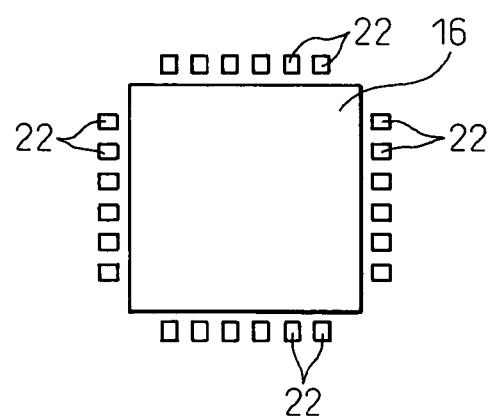
Figure 5C:
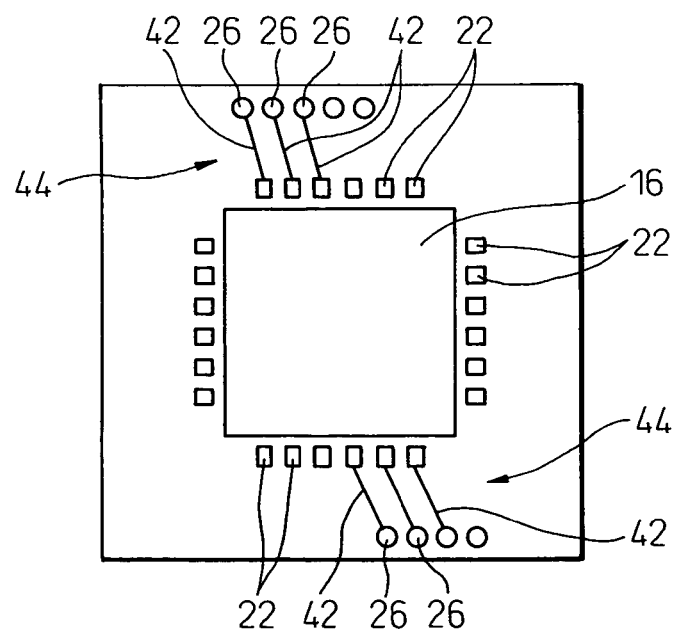

FIGS. 5A to 5C are views of a display screen of a computer, wherein FIG. 5A shows the external shape (maximum external shape) of the semiconductor device 16 drawn at step S11 (FIG. 4), while FIG. 5B shows the semiconductor device 16 and pads 22 corresponding to the electrodes of the semiconductor device 16 drawn at step S12 (FIG. 4). Further, FIG. 5C shows the semiconductor device 16 provisionally placed at steps S13 and S14 (FIG. 4) and rats nest 44.

Here, the rats nest 44 is only partially shown. The ball lands 26 drawn at step S12 are shown in FIG. 5C.

Figure 6:
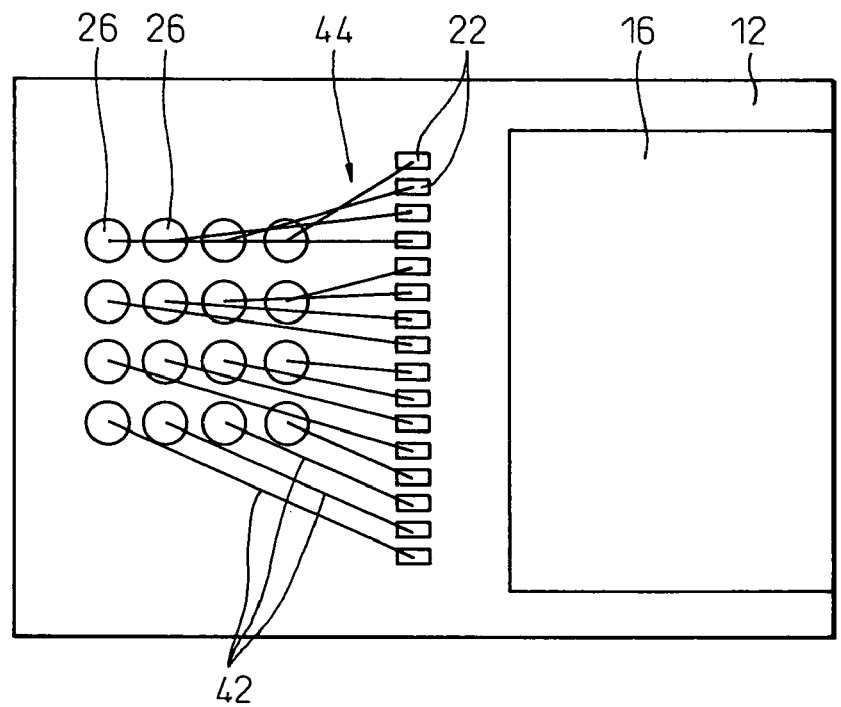
FIG. 6 is a view of part of a rats nest.

FIG. 6 shows part of a rats nest 44 in the case where the ball lands 26 are arranged in a concentrated manner.

The rats nest 44 is formed by connecting the pads 22 and ball lands 26, which are required to be electrically connected together, by lines 42 starting from the pads 22 and ending at the ball lands 26.

The rats nest 44 indicates the group of all lines 42.

The conductor lines 30 (FIGS. 2A to 2C) conductor line the pads 22 and the ball lands 26, so the direction of extension and density of the lines 42 of the rats nest 44 substantially match with the direction of extension and density of the conductor lines 30.

Therefore, the conductor lines 30 basically can be laid (drawn) along the lines 42 of the rats nest 44. However, the lines 42 of the rats nest 44 are straight lines and are small in line width as well. On the other hand, the actual conductor lines 30 are not necessarily straight, and the line width must also be considered. Therefore, the actual laying of conductor lines is sometimes difficult.

Next, at step S15 (FIG. 4), the density of the rats nest 44 is confirmed and the region with the highest density of lines 42 of the rats nest 42 is extracted.

This corresponds to the dense region extraction 58 (FIG. 3).

The region with the dense lines 42 of the rats nest 44 is also dense with conductor lines 30. In the region with the highest density of lines 42 of the rats nest 44, laying the conductor lines 30 is also difficult.

Figure 7:
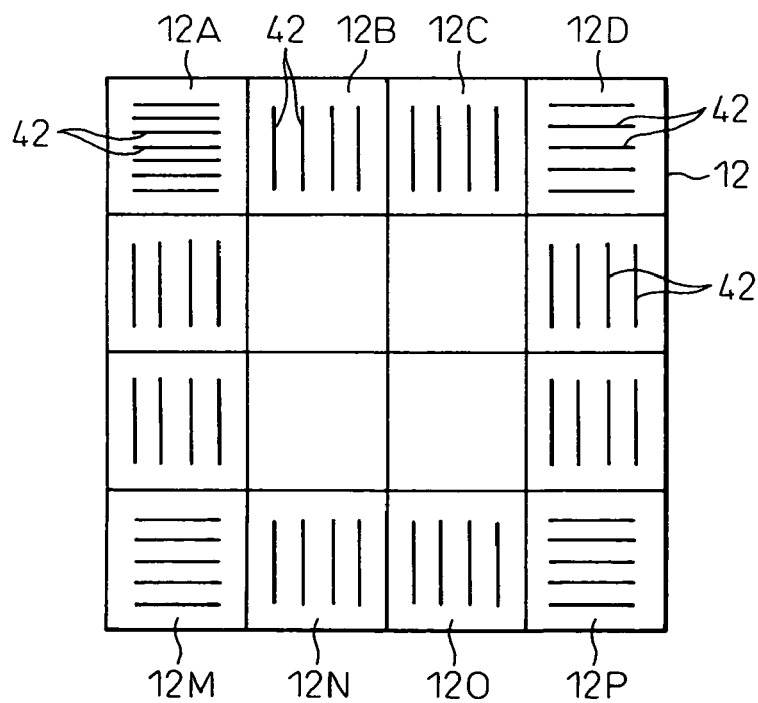
FIG. 7 is a view of an example of configuration of the density of a rats nest.

An example of the technique for confirming the density of the rats nest 44 is shown in FIG. 7.

In the technique shown in FIG. 7, the circuit board 12 (part of display of computer corresponding to circuit board 12) is divided into a plurality of regions and the region with the highest density of lines 42 of the rats nest 44 is extracted.

That is, as illustrated, the circuit board 12 is divided into 16 regions 12A, 12B, 12C to 12P. The densities of the rats nest in these regions are compared.

In the illustrated example, it is possible to judge that the density of the lines 42 of the rats nest is the highest at the region 12A.

Note that in FIG. 7, the lines 42 of the rats nest 44 is shown simplified for ease of understanding.

The regions of dense rats nest 44 are so dense that they are filled in by the lines 42 of the rats nest 44.

Note that if increasing the number of regions into which the circuit board is divided, the areas of the individual regions become small and the differences in density of the rats nest become hard to see, so the circuit board is preferably divided into four to 16 or so regions (in the case of a circuit board for a mobile phone).

Further, in the embodiment shown in FIG. 7, the external shapes of the divided regions were made equal squares, but shapes other than squares are also possible. Further, equal division is not required. The shapes can be selected in accordance with need.

By this method, the region with the highest density of lines 42 of the rats nest 44 is specified.

Next, the processing corresponding to the conductor line laying control 59 (FIG. 3) is performed.

At step S16 (FIG. 4), the design rules relating to the routes and dimensions of the conductor lines 30 at the region with the highest density of lines 42 of the rats nest 44 are set and the conductor lines 30 are laid in the region with the highest density of lines 42 of the rats nest 44.

Next, at step S17 (FIG. 4), it is confirmed whether or not the conductor lines 30 can be laid at the region with the highest density of lines 42 of the rats nest 44.

In this embodiment, the design rules are set to a) positions of the via lands 38 and 40, b) line width of conductor lines and inter-line distance (space between two conductor lines), c) diameter of via lands 38 and 40, and d) diameter of the ball lands 26

These factors are set with a priority of the order a to d. Further, the conductor lines are laid in the rats nest densest region based on the design rules.

First, the input design rules (initial values) 55 are used to lay the conductor lines at step S16.

Next, at step S17, it is confirmed whether or not the conductor lines 30 can be laid at the region with the highest density of lines 42 of the rats nest 44.

If the conductor lines cannot be laid by the set design rules (initial values) 55, the routine returns to step S16, where setting of the design rules and the laying of the conductor lines are repeated at the region with the highest density of the lines 42 of the rats nest 44. In this case, at the conductor line laying control 59 (FIG. 4), alternative values for the design rules (initial values) are searched for from the data base 61 and the design rules are renewed. Further, the conductor lines are laid and the results of step S17 are examined.

By doing this, the design rules enabling the conductor lines 30 to be laid in the region with the highest density of lines 42 of the rats nest 44 are sought.

If it is judged at step S17 that the conductor lines 30 can be laid in the region with the highest density of lines 42 of the rats nest 44, the conductor lines 30 are laid in the remaining region at step S18 (FIG. 4).

In this case, the conductor lines 30 are laid in accordance with the design rules set at step S16. The region with the highest density of the lines 42 of the rats nest 44 is the region where laying the conductor lines 30 is the most difficult, so if using the design rules set here, it is possible to lay the conductor lines reliably and easily at the other regions.

At step S19 (FIG. 4), the wiring diagram is completed.

When the wiring diagram finishes being designed, the conductor lines 30 are formed on the circuit board 12 based on the wiring diagram.

In the method of designing a circuit board according to the present invention, setting the design rules at the region with high density rats nest at steps S16 and S17 (FIG. 4) is important.

In the method of the related art, there was no such process. For example, the routine proceeded until all conductor lines were laid at step S18 (FIG. 4), it was judged if the conductor lines could be laid at the final stage of laying the conductor lines, and, if not possible, the routine returned to step S13 (FIG. 4) where the design was redone.

In the design of the circuit board 12, laying the conductor lines of step S18 (FIG. 4) is the process requiring the most time. If returning to the previous process after laying almost all conductor lines, the number of design steps greatly increases.

In the present invention, feedback is performed at steps S16 and S17.

This feedback is performed before laying the conductor lines of step S18. Further, since only step S16 right before step S17 is returned to, the number of design steps can be greatly reduced, down to about one-half, compared with the method of related art.

In the present invention, the basic priority order for setting the design rules is made (1) the arrangement of via lands considering suitable diameter, (2) line width of conductor lines and inter-line distance, (3) diameter of via lands, (4) diameter of ball lands, and (5) ball layout.

However, this is not absolute. The order may also be changed.

The grounds for using this priority order are that, in the production of a circuit board, the positions of the via lands can be determined in advance to a certain extent at the initial stage and that the line width of the conductor lines and the inter-line distance can be changed relatively easily.

Next, the diameter of the via lands is related to the precision when forming the vias by drilling or laser boring. Further, the diameter of the ball lands is preferably kept from being made small as much as possible since contact area with the solder balls would become smaller if made smaller and the strength would fall when mounted to the mother board.

On the other hand, the ball layout is related to the assembly jig (test socket or shipment tray) or mother board to be connected to.

However, when the ball layout is not determined at this time, it is possible to partially change the priority order to (1) ball layout, (2) arrangement of via lands considering suitable diameter, (3) line width of conductor lines and conductor line pitch, (4) diameter of via lands, and (5) diameter of ball lands.

Figure 8:
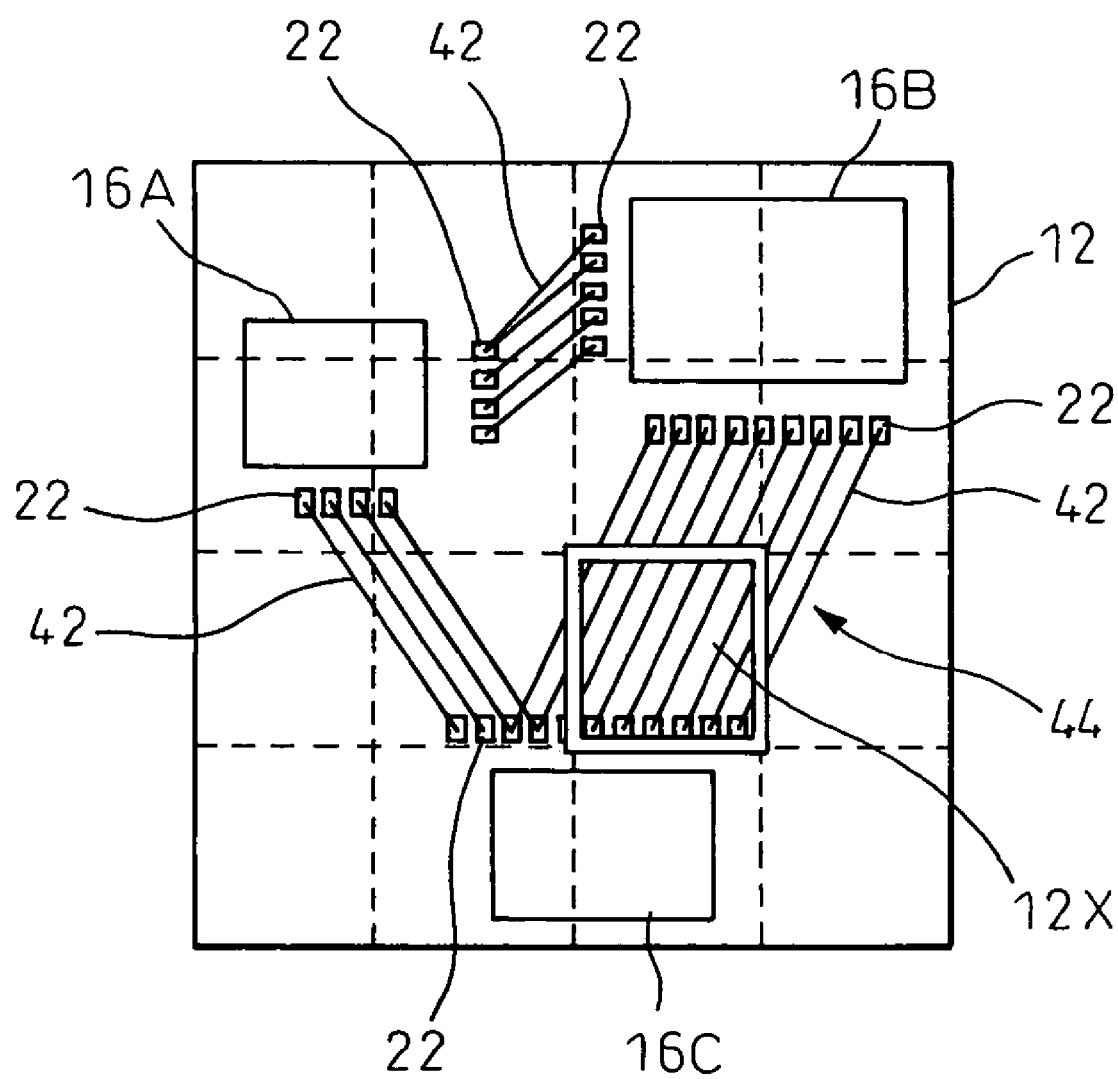
FIG. 8 is a view for explaining another example of the method of designing a circuit board.

FIG. 8 shows another embodiment of the method of design of a circuit board according to the present invention.

In the embodiment shown in FIG. 8, a single circuit board 12 mounts three electronic devices 16A, 16B, and 16C.

In this case as well, it is possible to design the circuit board 12 by the routine shown in step S11 to S20 shown in FIG. 4.

In the configuration of FIG. 8, the state in step S14 of FIG. 4 is shown. Three electronic devices 16A, 16B, and 16C to be mounted on the circuit board 12 are laid out in the floor plan, and a rats nest 44 is formed.

This rats nest 44 is comprised by the lines (not shown in FIG. 8) interconnecting the pads 22 and the ball lands 26, and the lines 42 connecting the pads corresponding to the three electronic devices 16A, 16B, and 16C and the pads 22 corresponding to the other semiconductor devices.

Therefore, when the rats nest 44 formed by the lines connecting the pads 22 of the electronic device 16B and the pads 22 of the electronic device 16C has the highest density in the regions 12X among the 12 regions obtained by dividing the board 12, the design rules are set for the region 12X.

Below, the basic algorithms for setting the design rules will be explained in further detail.

Here, the explanation will be given of an example of an interposer including two conductor layers (FIGS. 1 and 2A to 2C), but the present invention may also be applied to a circuit board including three or more conductor layers.

The design of the circuit board becomes simpler by increasing the number of conductor layers, since the design rules for each conductor layer are eased. However, increasing the number of conductor layers invites a large rise in the cost of production (if increasing the number from two layers to four layers, the cost approximately doubles).

In mobile phones and other consumer product applications, low cost is essential. The designers have to reduce the number of conductor layers of the circuit board as much as possible to enable a predetermined electronic device to be mounted in the design.

FIGS. 9A to 9C show an example 56 a circuit board for explaining a reference example for setting a design rule, wherein FIG. 9A is a top view of the circuit board, FIG. 9C is a bottom view of the circuit board in the state seen from the top side in the see-through state, and FIG. 9B is a sectional view along the line X-X in FIG. 2A or FIG. 9C.

In the figures, the members corresponding to the parts of the configuration shown in FIGS. 5A to 5C are assigned the same reference numerals as in FIGS. 5A to 5C.

Here, first, the arrangement of the via lands 38 and 40 is set as follows.

First, the via lands 38 and 40 are arranged near the ends of the lines 42 of the rats nest 44, to reduce the portions of the conductor lines at the side of the circuit board 12 with a small area for conductor lines to be laid, that is, the side where the ball lands are arrayed.

The first side (top side) of the circuit board 12 is provided with the first linear parts 32 and the via lands 38, while the second side (bottom side) of the circuit board 12 is provided with the second linear parts 34, the via lands 40, and the ball lands 26.

Figure 11A:
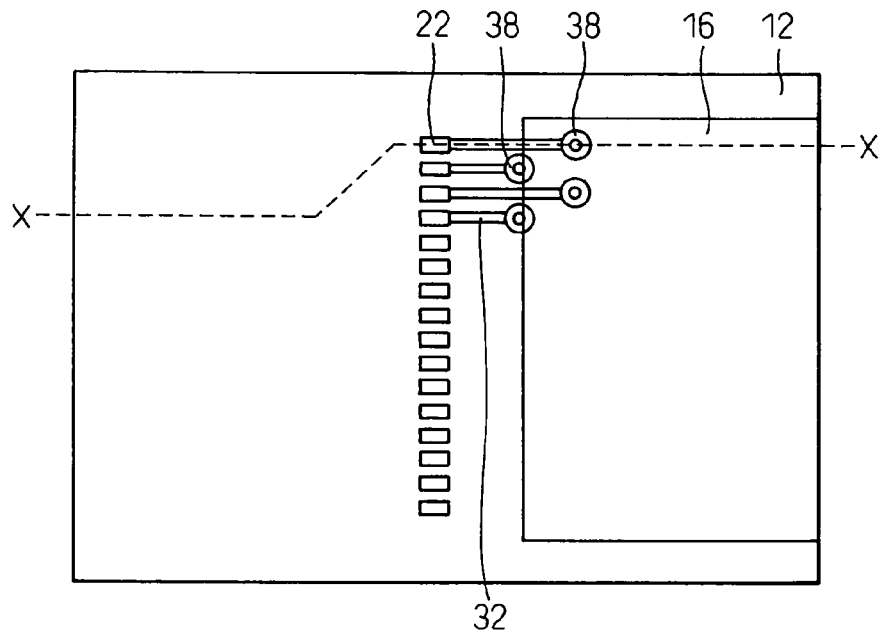
Figure 11B:
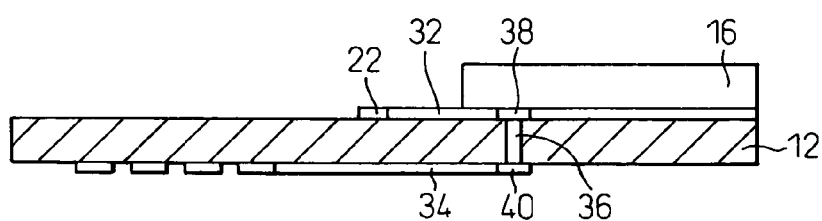
Figure 11C:
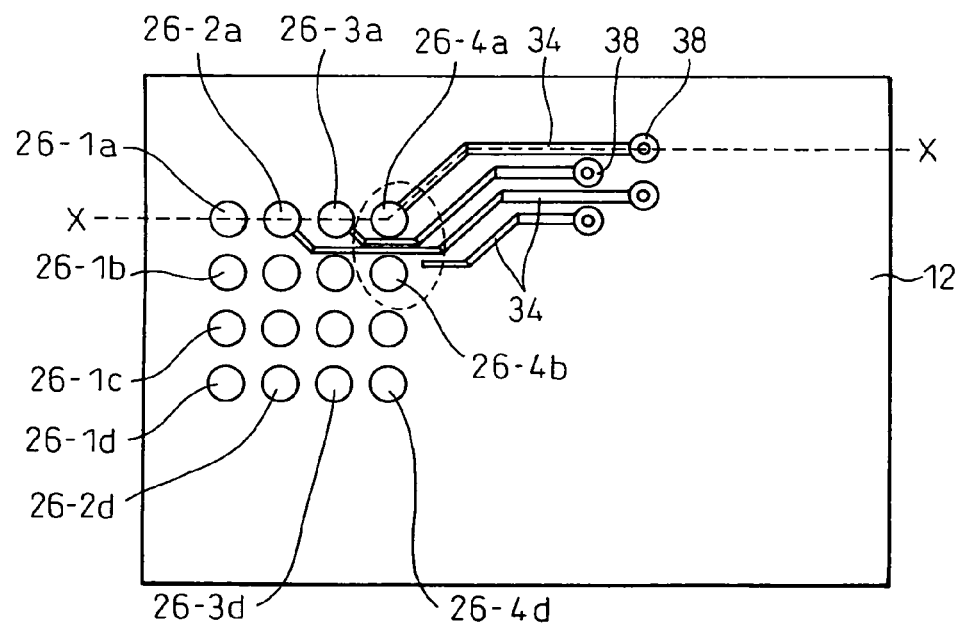

That is, referring to FIG. 11C, the second side has to be provided with the ball lands 26, so there is no extra space for laying the conductor lines (low freedom of laying).

Therefore, it is preferable to arrange the via lands 38 and 40 close to the ends of the lines 42 of the rats nest 44, that is, close to the ball lands 26, and to make the second linear parts 34 of the second side of the circuit board 12 shorter.

Figure 10A:
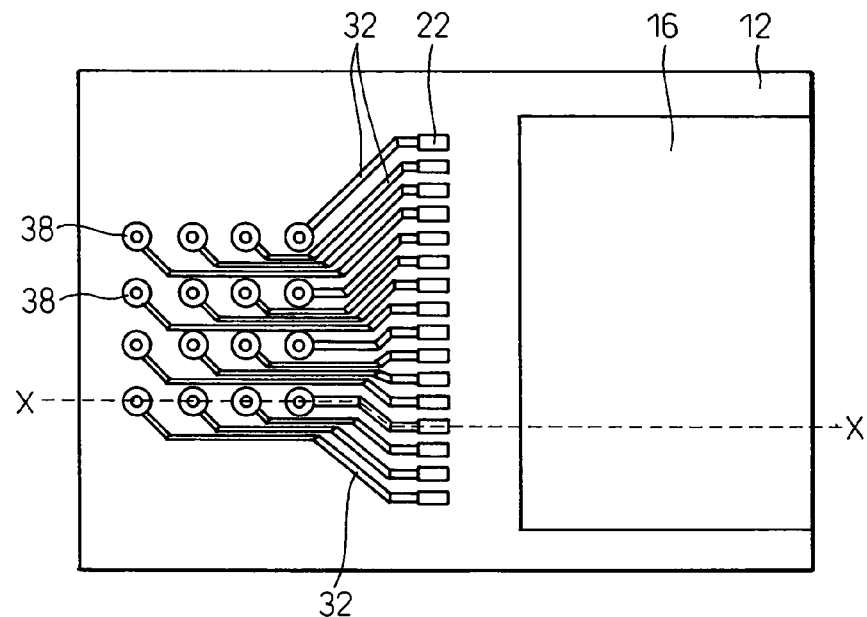
Figure 10B:
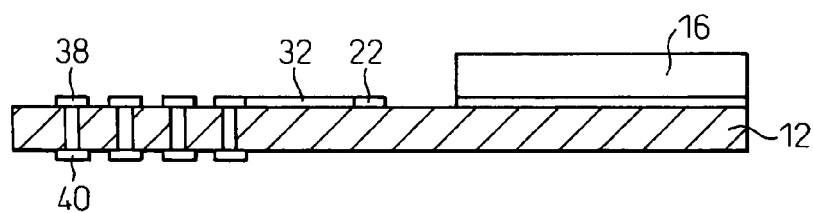
Figure 10C:
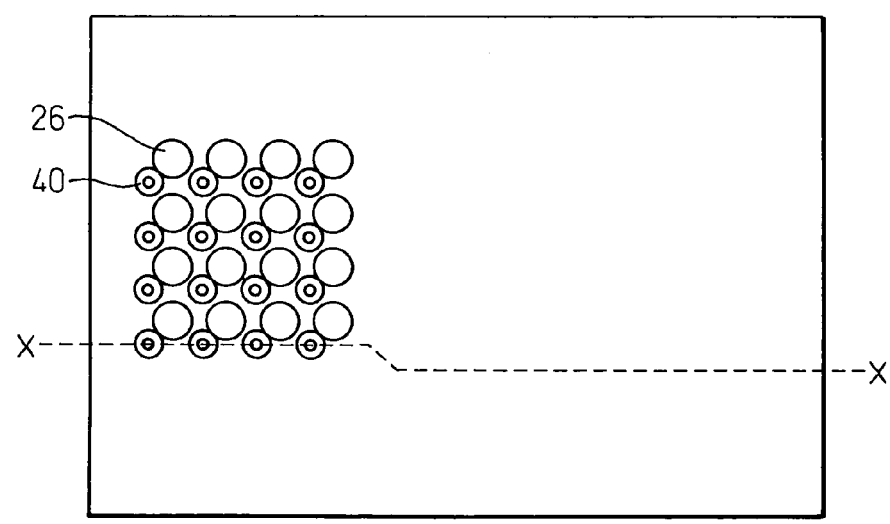

FIGS. 10A to 10C show an example of conductor lines laid according to the design rules of FIGS. 9A to 9C, wherein FIG. 10A is a top view, FIG. 10C is a bottom view of the see-through state, and FIG. 10B is a sectional view along the line X-X in FIG. 10A or FIG. 10C.

In the figures, the via lands 38 and 40 are close to the ball lands 26. The first side of the circuit board 12 is provided with the first linear parts 32 and the via lands 38.

At the second side of the circuit board 12, the via lands 40 and the ball lands 26 are connected directly or through short second linear parts 34.

Even if the via lands 40 and the ball lands 26 are not directly connected, since the second linear parts 34 can be made short and arranged near the ball lands 26, the second linear parts 34 can be easily laid.

FIGS. 11A to 11C show a reference example of conductor lines, wherein FIG. 11A is a top view, FIG. 11C is a bottom view in the see-through state, and FIG. 11B is a sectional view along the line X-X in FIG. 11A or FIG. 11C.

As shown in the figures, when the via lands 38 and 40 are arranged near the pads 22, the first side of the circuit board 12 is provided with the first linear parts 32 and the via lands 38, while the second side of the circuit board 12 is provided with the second linear parts.

In this case, the plurality of second linear parts 34 have to be set between the adjoining columns of ball lands 26.

For example, when providing four columns of ball lands 26-1 to 26-4, if assuming that three second linear parts 34 have to be passed between the two adjoining ball lands 26-4a and 26-4b (surrounded by broken line in figures) in the inwardmost ball land column 26-4, an interval of at least the total of the line widths of three conductor lines, two inter-line separating distances, and two separating distances each of which is between the conductor line and the land becomes necessary between the two ball lands 26.

For example, if the pitch between the ball lands 26 is 0.8 mm and the diameter of the ball lands 26 is 0.55 mm, the distance between two ball lands 26 becomes 0.25 mm.

Here, assuming that the line width of the conductor lines is 50 µm and the inter-line distance is 50 µm, the number of conductor lines which can be laid is limited to two.

Therefore, it is preferable to lay the conductor lines at the first side of the circuit board 12 (chip mounting side), to arrange the via lands 38 and 40 near the ball lands 26, and to reduce the laying of conductor lines at the second side of the circuit board 12 (ball land side).

Next, the line width of the conductor lines and the inter-line distance are set.

By using the first side of the circuit board 12 with the high layout freedom as the location for setting the desired conductor lines, a leeway occurs in the design rules.

In the embodiment shown in FIG. 10A, if the diameter of the via lands 38 and 40 is made 0.35 mm, the interval between adjoining columns of the via lands 38 is 0.45 mm.

Even with design rules of a line width of the conductor lines of 50 µm and an inter-line distance of 50 µm, four conductor lines can be passed (0.45 mm÷(4 conductor lines+4 spaces)=0.05 mm).

That is, even with the same design rules, compared with the configuration shown in FIG. 11C, double the number of conductor lines can be arranged. This is based on the diameter of the via lands 38 and 40 being smaller than the diameter of the ball lands 26 and the space for laying the conductor lines being large.

Further, in the embodiment shown in FIG. 10A, in the interval of 0.45 mm between the adjoining columns of via lands 38, as many as three conductor lines may be arranged, so the width of the conductor lines can also be made 0.064 mm (0.45÷(3 conductor lines+4 spaces)=0.064 mm).

Figure 12:
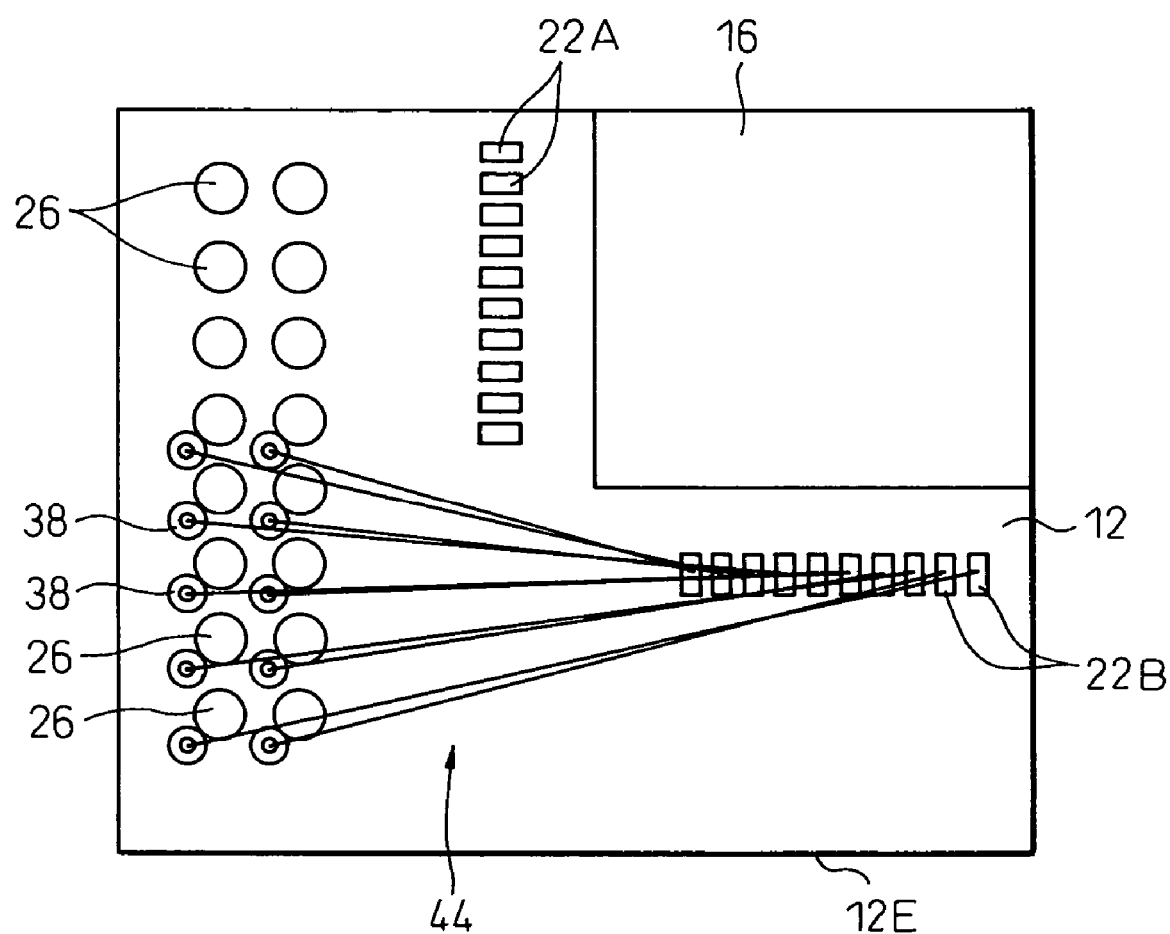
FIG. 12 is a view of an example of setting a line width of conductor lines and inter-line pitch.

FIG. 12 shows an example of setting the line width of the conductor lines and the inter-line distance.

Figure 13A:
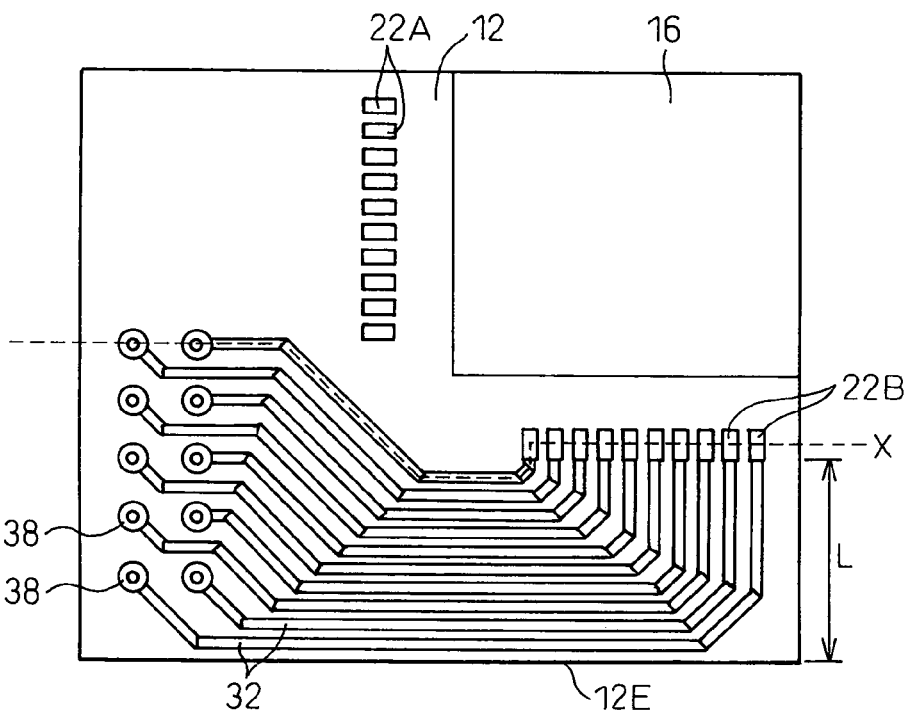
Figure 13B:
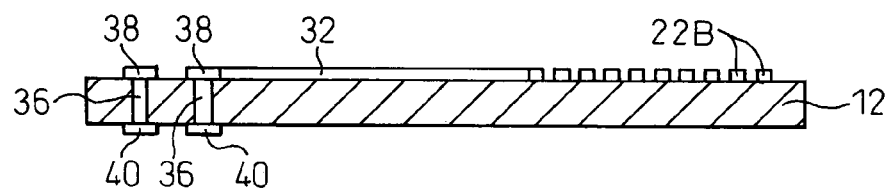
Figure 13C:
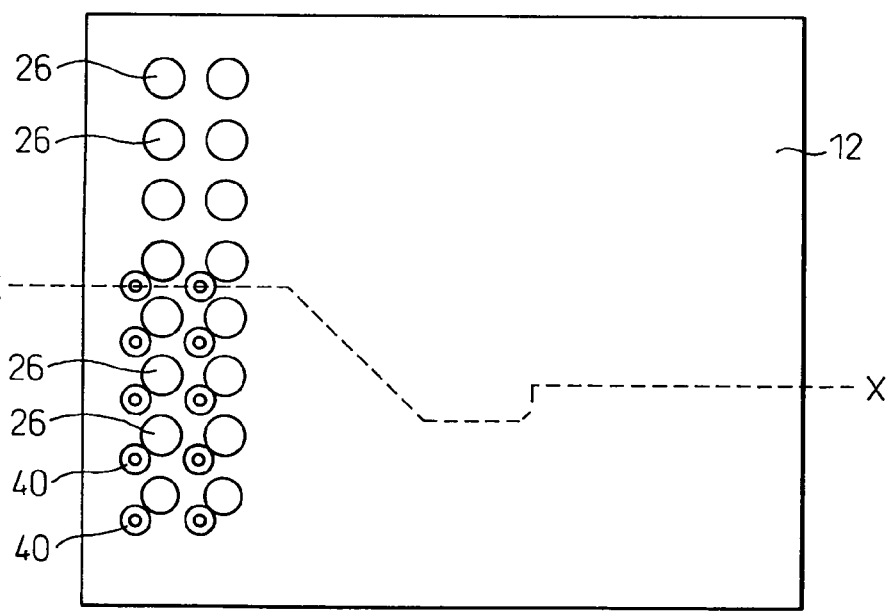

FIGS. 13A to 13C show an example of conductor lines formed based on the rats nest of FIG. 12, wherein FIG. 13A is a top view, FIG. 13C is a bottom view of the see-through state, and FIG. 13B is a sectional view along the line X-X in FIG. 13A or 13C.

In the layout of pads and via lands shown in FIG. 12, the rats nest 44 connecting the pads 22B and via lands 38 positioned at one edge 12E side of the circuit board 12 are dense.

In this layout of the pads and via lands, the conductor lines 32 connecting the pads 22B and the via lands 38 are arranged at the region formed with the distance L between the pads 22B and the edge 12E of the circuit board 12 as shown in FIG. 13A.

If the distance L between the pads 22B and the edge 12E of the circuit board 12 is 1.1 mm, when laying 10 conductor lines there, distances of 10 conductor lines and 11 inter-line distances are required, i.e., 1.1 mm÷(10+11)≈0.052 mm.

That is, if the line width of the conductor lines 32 is 50 µm and the inter-line distance is 50 µm, the conductor lines can be laid.

Note that to facilitate the calculation, the numerical values of the line width of the conductor lines and the inter-line distance are made the same (50 μm/50 μm).

When the numerical values of the line width and the inter-line distance of the conductor lines differ, this should be considered from the start (for example, line width of conductor lines=40 μm and inter-line width pitch=50 μm).

Further, here, the distance between the bottommost conductor line and the edge 12E of the circuit board 12 and the inter-line distance are made the same, but they may also be made different.

Figure 14A:
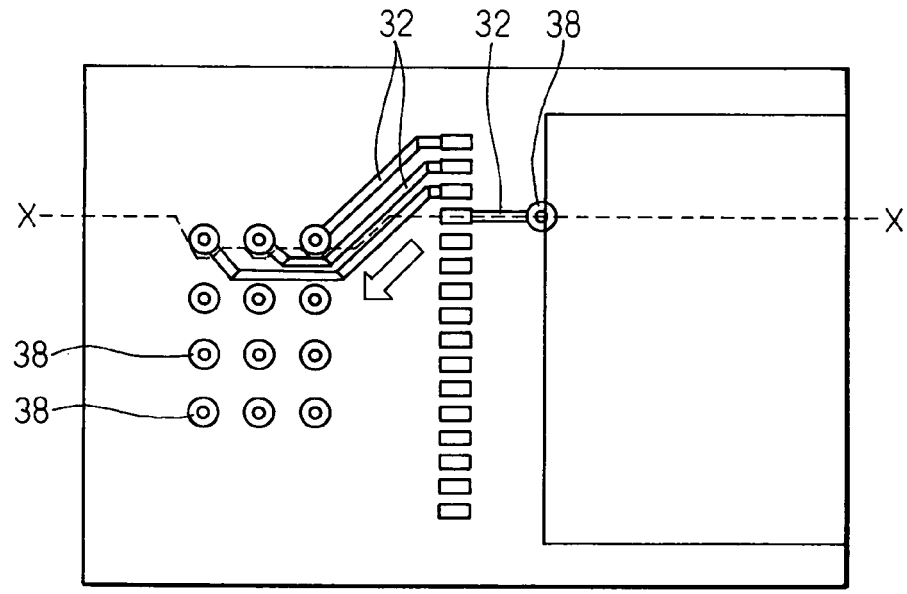
Figure 14B:
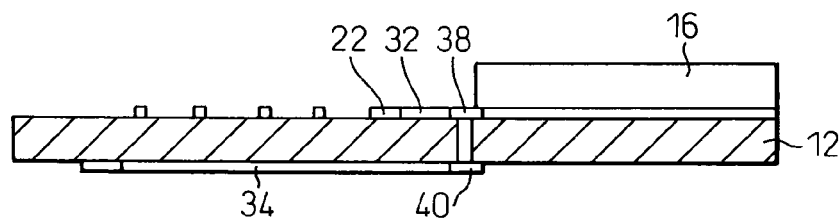
Figure 14C:
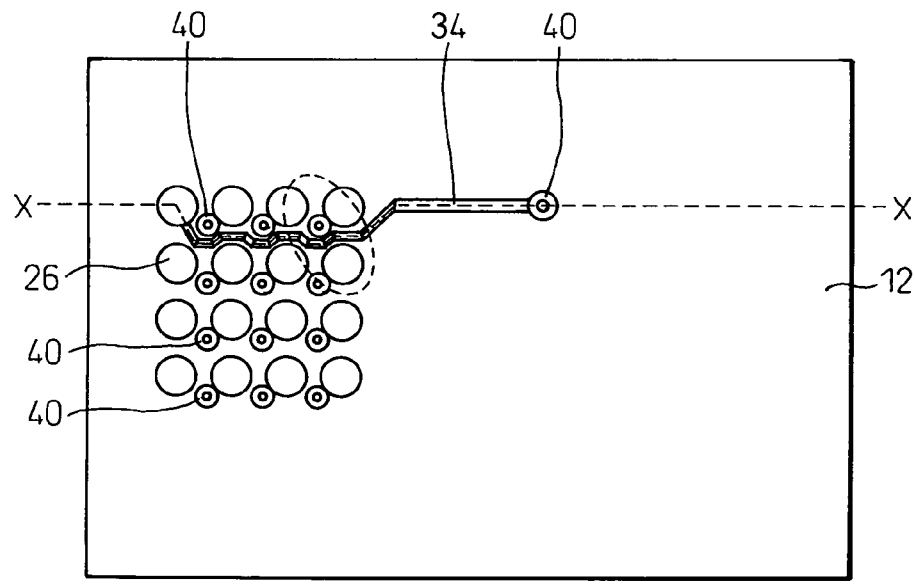

FIGS. 14A to 14C show a reference example for setting the design rules, wherein FIG. 14A is a plan view (top view), FIG. 14C is a bottom view of the see-through state, and FIG. 14B is a sectional view along the line X-X in FIG. 14A or 14C.

In the embodiment shown in FIGS. 14A to 14C, three conductor lines are laid at the first side of the circuit board 12, while the via lands 38 and 40 are arranged near the ball lands 26.

The remaining one conductor line connects the via lands 38 and 40 by a second line part 34 arranged at a different position from the ball lands 26 and laid at the second side of the circuit board 12.

In FIG. 14A, the fourth conductor line is desirably laid at the first side of the circuit board 12 as shown by the arrow, but sometimes this is not possible.

For example, when it is necessary to make two conductor lines thick like with power lines, the line width of the two conductor lines is made 150 μm, the line width of the remaining conductor lines is made 50 μm, the inter-line distance is made 50 μm, and the interval between adjoining columns of via lands 38 is made 0.45 mm.

In this case, if trying to lay all conductor lines at the first side of the circuit board 12, one out of the four conductor lines extends straight toward the via lands 38, so the remaining three conductor lines have to be laid between the adjoining columns of via lands 38.

The result is (150 μm×2 conductor lines)+(50 μm×1 conductor line)+(50 μm×4 conductor lines)=0.55 mm. Three conductor lines cannot be passed in the 0.45 mm interval. Therefore, the remaining one conductor line is laid at the second side of the circuit board.

That is, one conductor line is laid at the second side of the circuit board between the column of via lands 40 and the column of ball lands 26.

If the diameter of the ball lands 26 is 0.55 mm, the interval between adjoining columns of ball lands 26 is 0.25 mm, and the diameter of the via lands 40 is 0.35 mm, it is difficult to pass one conductor line between the column of via lands 40 and the column of ball lands 26. Therefore, by changing the diameter of the via lands from 0.35 to 0.30 mm, it becomes possible to pass one conductor line with the-like width of 50 μm between a column of the via lands 40 and a column of the ball lands 26. Conversely, it is also possible to leave the diameter of the via lands 40 as it is and change the diameter of the ball lands from 0.55 mm to 0.50 mm.

Figure 15A:
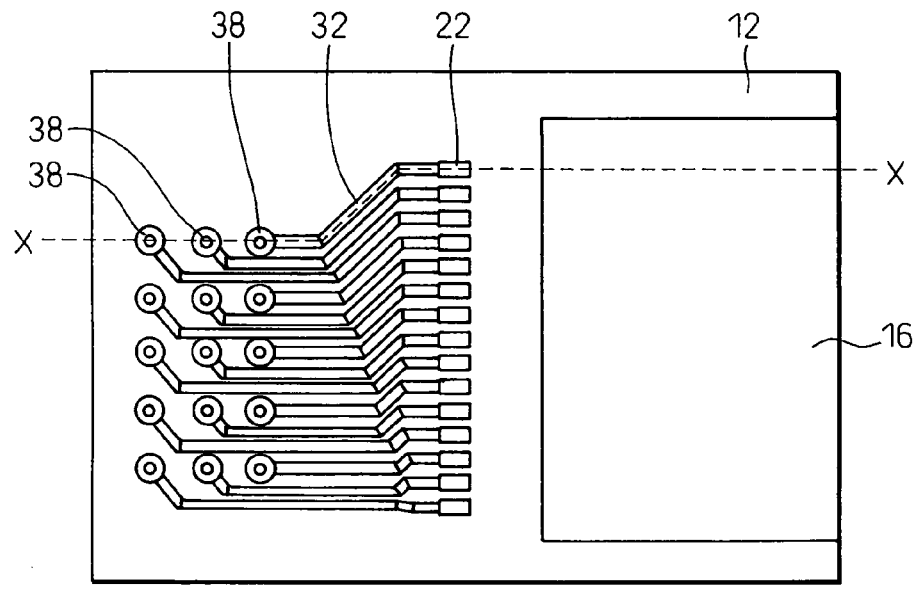
Figure 15B:
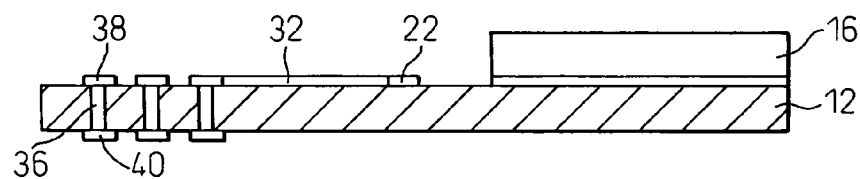
Figure 15C:
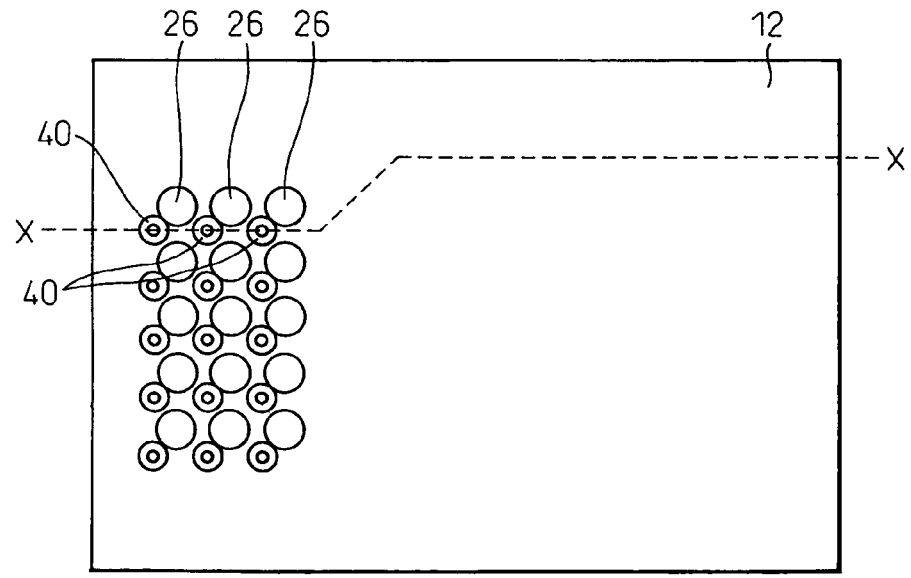

FIGS. 15A to 15C shows a reference example in setting the design rule, wherein FIG. 15A is a top view, FIG. 15C is a bottom view in the see-through state, and FIG. 15B is a sectional view along the line X-X in FIG. 15A or FIG. 15C.

When conductor lines cannot be laid at the first side of the circuit board, it is sufficient to lay some of the conductor lines at the second side of the circuit board, but even so sometimes this is not enough.

In the example shown in FIGS. 14A to 14C, this problem is dealt with by changing the diameter of the via lands 38 and 40 from 0.35 mm to 0.30 mm, but even so sometimes it is difficult to pass an conductor line between the column of the via lands 40 and the column of the ball lands 26.

In the configuration of FIGS. 15A to 15C, the layout of the ball lands 26 is changed from the four columns of ball lands 26 to three columns of ball lands 26. Only naturally, along with the change of the layout of the ball lands 26, the rats nest is also changed.

Therefore, this standard for determination of the design rules is preferably not used as much as possible.

Figure 17:
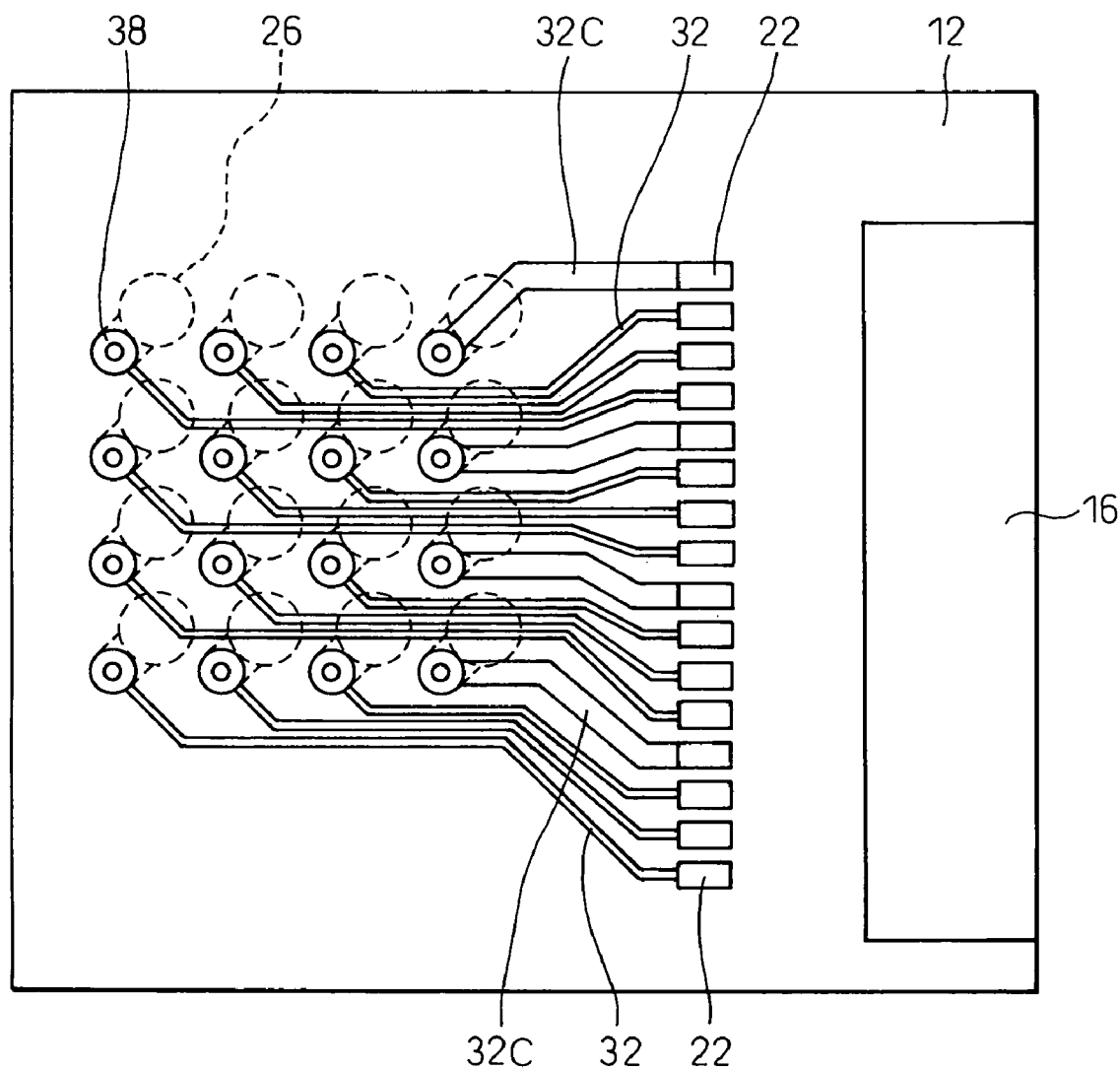
FIG. 17 is a view of a circuit board having conductor lines formed by the design method of FIG. 16.
Figure 18:
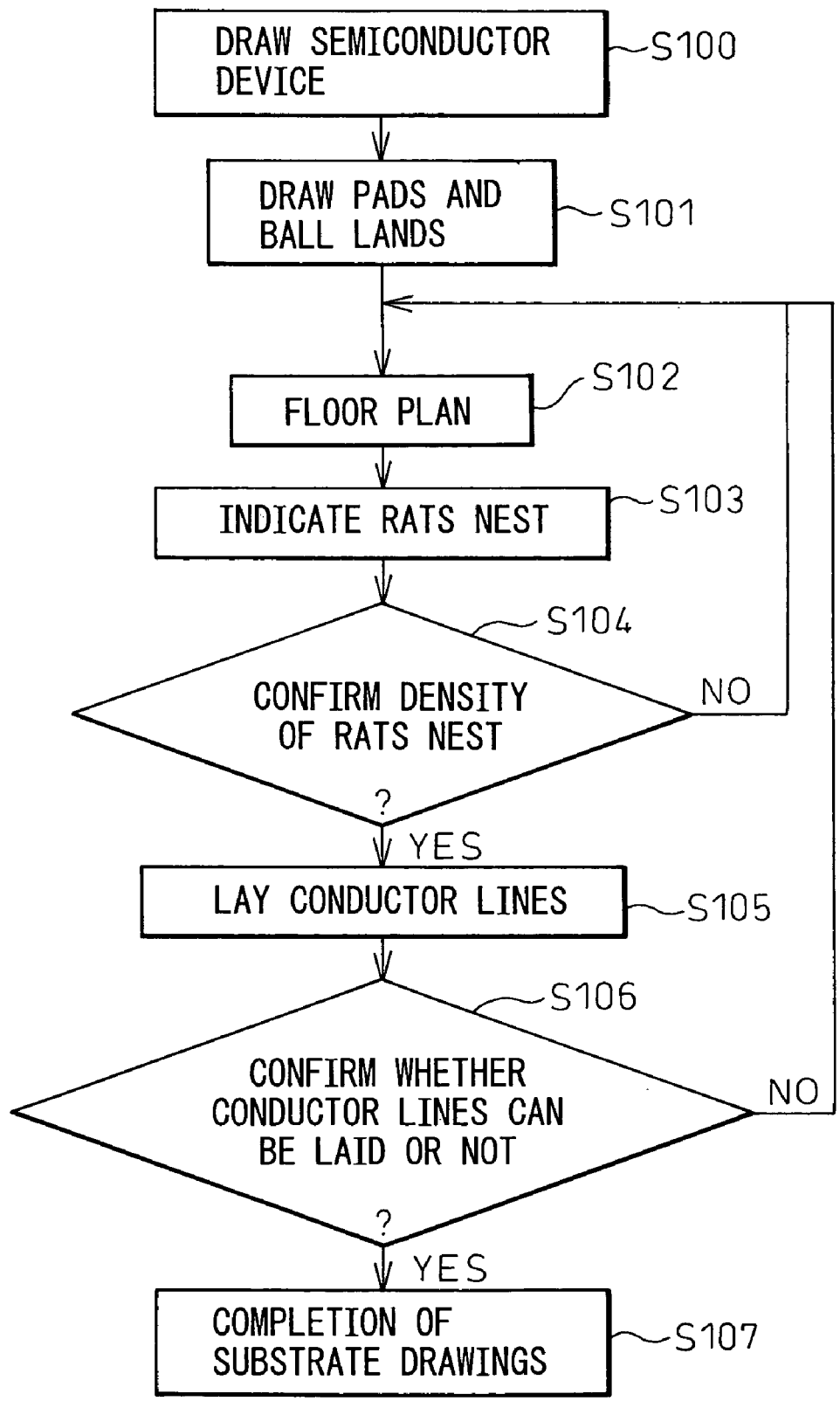
FIG. 18 is a flow chart of the method of designing a circuit board of the related art.

FIG. 16 is a flow chart explaining the method of designing a circuit board according to another embodiment of the present invention. FIG. 17 shows a circuit board having conductor lines formed by the design method of FIG. 16.

In this embodiment, specific conductor lines are laid preferentially, then the region with the highest density of lines of the rats nest is extracted, and the remaining conductor lines are laid.

In the embodiment shown in FIG. 17, as specific conductor lines, there are the four critical net conductor lines 32C. These conductor lines 32C are for example power lines and other conductor lines with small inductance values.

In this embodiment, steps similar to steps S11 to S13 in the embodiment shown in FIG. 4 are performed, then step S14 similar to the embodiment shown in FIG. 4 is executed and the rats nest is displayed.

Suitably thereafter, at step S21 to step S24 (FIG. 16), the region with the highest density of lines of the rats nest is extracted, then the remaining conductor lines are laid while setting the design rules.

In this way, when there is a net with restrictive conditions of the conductor lines (critical net) due to the electrical characteristics or other viewpoints, the design rules are determined preferentially for a critical net. Next, the rats nest is applied to complete the laying of the conductor lines, then all conductor lines are laid.

In this way, according to the present invention, it is possible to efficiently design a small circuit board with a dense rats nest using CAD. The design rules of the line width of conductor lines, the distance between conductor lines, the position and diameter of via lands, the ball lands, diameters, etc. are set from the density of the rats nest and the conductor lines laid.

Before laying the actual conductor lines, it is possible to set the design rules enabling almost all conductor lines to be laid, so it is possible to greatly suppress the backtracking in the design process and greatly shorten the number of design steps compared with the method of production of the related art.

While the invention has been described with reference to specific embodiments chosen for purpose of illustration, it should be apparent that numerous modifications could be made thereto by those skilled in the art without departing from the basic concept and scope of the invention.

What is claimed is:

1. A method of designing a circuit board, comprising:
   setting, with respect to a circuit board, a mounting position of an electronic device, positions of pads to which terminals of the electronic device are connected, and positions of external connection terminals;
   forming a rats nest by connecting said pads and external connection terminals by straight lines;
   extracting a region with the highest density of lines of the rats nest;
   setting design rules relating to routes and dimensions of conductor lines in the region with the highest density of lines of the rats nest;

laying the conductor lines at the region with the highest density of lines of the rats nest;

confirming whether or not the conductor lines can be laid at the region with the highest density of lines of the rats nest;

repeating setting of the design rules and laying of the conductor lines if the conductor lines cannot be laid, and laying the conductor lines of the remaining regions by the set design rules if the conductor lines can be laid.

2. The method of designing a circuit board as set forth in claim 1, further comprising dividing the circuit board into a plurality of regions and extracting the region with the highest density of lines of the rats nest from the plurality of regions.

3. The method of designing a circuit board as set forth in claim 1, wherein the electronic device and pads are formed on a first surface of the circuit board, the external connection terminals are formed on a second surface of the circuit board, and the conductor lines are laid from the first surface of the circuit board through vias to the second surface.

4. The method of designing a circuit board as set forth in claim 1, wherein the setting of the design rules comprises setting at least one of a line width of the conductor lines, an inter-line distance, via land positions, via land dimensions, external connection terminal dimensions, and external connection terminal positions.

5. The method of designing a circuit board as set forth in claim 1, wherein the setting of the design rules comprising setting at least two of a line width of the conductor lines, an inter-line distance, via land positions, via land dimensions, external connection terminal dimensions, and external connection terminal positions, in accordance with a predetermined priority order.

6. The method of designing a circuit board as set forth in claim 1, further comprising laying specific conductor lines, then extracting the region with the highest density of lines of the rats nest, and laying the remaining lines.

7. A method of designing a circuit board, comprising:

setting, with respect to a circuit board, mounting positions of a plurality of electronic devices positions of pads to which terminals of the electronic devices are connected, and positions of external connection terminals;

forming a rats nest by connecting said pads and external connection terminals by straight lines and connecting pads to which terminals of the plurality of electronic devices are connected by lines;

extracting a region with the highest density of lines of the rats nest;

setting design rules relating to routes and dimensions of conductor lines in the region with the highest density of lines of the rats nest;

laying the conductor lines at the region with the highest density of lines of the rats nest;

confirming whether or not the conductor lines can be laid at the region with the highest density of lines of the rats nest;

repeating setting of the design rules and laying of the conductor lines if the conductor lines cannot be laid, and laying conductor lines of the remaining regions by the set design rules if the conductor lines can be laid.

\* \* \* \* \*